(12) United States Patent
Liu et al.

(10) Patent No.: US 9,103,601 B2
(45) Date of Patent: Aug. 11, 2015

(54) HEAT DISSIPATION DEVICE ASSEMBLY STRUCTURE

(75) Inventors: Jin-Hsun Liu, New Taipei (TW); Chih-Ming Chen, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 319 days.

(21) Appl. No.: 13/469,735

(22) Filed: May 11, 2012

(65) Prior Publication Data

US 2013/0299155 A1 Nov. 14, 2013

(51) Int. Cl.
| H05K 7/20 | (2006.01) |
| F28D 15/02 | (2006.01) |
| H01L 23/367 | (2006.01) |
| H01L 23/427 | (2006.01) |
| H01L 23/467 | (2006.01) |
| F28F 7/00 | (2006.01) |

(52) U.S. Cl.
CPC ........ *F28D 15/0275* (2013.01); *H01L 23/3672* (2013.01); *H01L 23/427* (2013.01); *H01L 23/467* (2013.01); *H01L 2924/0002* (2013.01)

(58) Field of Classification Search
CPC ... H01L 23/4093; H01L 23/467; H01L 24/72; H01L 24/73
USPC .......... 165/67, 76, 80.3, 185, 104.33, 104.21; 361/700, 704, 719; 257/719, 726
See application file for complete search history.

(56) References Cited

U.S. PATENT DOCUMENTS

| 6,386,274 | B1 * | 5/2002 | Wang et al. .................. | 165/80.3 |
| 6,945,319 | B1 * | 9/2005 | Li et al. .................... | 165/104.33 |
| 7,650,929 | B2 * | 1/2010 | Huang ........................ | 165/80.3 |
| 8,251,132 | B2 * | 8/2012 | Cao et al. .................... | 165/80.3 |
| 2001/0030037 | A1 * | 10/2001 | Hellbruck et al. ........... | 165/80.3 |
| 2004/0252463 | A1 * | 12/2004 | Wu .............................. | 361/719 |
| 2007/0284084 | A1 * | 12/2007 | Lin .............................. | 165/80.3 |
| 2008/0121371 | A1 * | 5/2008 | Zhou et al. .................. | 165/80.3 |
| 2009/0242168 | A1 * | 10/2009 | Cao et al. .................... | 165/80.3 |

\* cited by examiner

*Primary Examiner* — Tho V Duong

(57) ABSTRACT

A heat dissipation device assembly structure includes a heat dissipation unit and at least one fastening member. The heat dissipation unit has a bottom face and a locating section. The locating section is formed with at least one channel in communication with the bottom face. The fastening member is assembled on the bottom face. The fastening member has at least one latch section correspondingly inserted in the locating section. The fastening member further has at least one locking section on one side of the fastening member, which side is distal from the bottom face. The fastening member can be quickly assembled with the heat dissipation unit by means of inserting the latch section into the locating section of the heat dissipation unit. The heat dissipation device assembly structure has higher heat dissipation efficiency and is free from welding process so that the welding cost is saved.

3 Claims, 4 Drawing Sheets

HEAT DISSIPATION DEVICE ASSEMBLY STRUCTURE

BACKGROUND OF THE INVENTION

1. Field of the Invention

The present invention relates generally to a heat dissipation device assembly structure, and more particularly to a heat dissipation device assembly structure, which can be quickly assembled and permits airflow to more easily flow to the surrounding of the electronic component so as to increase the heat dissipation efficiency.

2. Description of the Related Art

Following the development of electronic industries and techniques, the density of transistors of various chips (such as central processor) has been more and more increased. This enables the central processor to process data at higher and higher speed. However, the power consumption and heat generated by the central processor have also become higher and higher. In order to keep the central processor stably operating, a heat dissipation unit or a cooling fan is generally applied to the central processor for dissipating the heat. In addition, the heat dissipation unit is usually provided with a heat pipe to more quickly dissipate the heat.

The conventional heat dissipation unit with a heat pipe must be further provided with a fastening means for affixing and attaching the heat dissipation unit to the central processor. The fastening means can be connected with the heat dissipation unit in several manners. In general, the fastening means is connected with the heat dissipation unit by means of welding or riveting. With respect to welding, it is necessary to heat and fuse the work pieces. With respect to riveting, it is necessary to apply a pressure to the work pieces with an external mechanical device. Therefore, either connection measure leads to waste of energy and increase of cost. Moreover, the main body of the fastening means is required to have sufficient strength. In the case that the fastening means is too thin, the fastening means is subject to deformation. Therefore, the main body of the fastening means must have a considerable thickness and volume. This incurs a new problem. That is, the fastening means with an enlarged volume is likely to interrupt the airflow around the central processor. This makes the heat uneasy to dissipate. As a result, the temperature of the electronic components around the central processor will be too high and thus the lifetime of the electronic components will be shortened.

In addition, the conventional heat dissipation unit further has a base seat. In general, the heat pipe passes through the heat dissipation unit and partially connects with the base seat by means of welding. The additional welding cost leads to increase of the manufacturing cost.

According to the above, the conventional technique has the following shortcomings:
1. The heat dissipation efficiency is poorer.
2. The cost is increased.
3. The lifetime of the electronic components is shortened.

SUMMARY OF THE INVENTION

It is therefore a primary object of the present invention to provide a heat dissipation device assembly structure, which can be quickly assembled and permits airflow to more easily flow to the surrounding of the electronic component so as to increase the heat dissipation efficiency.

It is a further object of the present invention to provide the above heat dissipation device assembly structure, which is free from welding process so that the additional welding cost of the conventional heat dissipation unit and fastening means is saved.

To achieve the above and other objects, the heat dissipation device assembly structure of the present invention includes a heat dissipation unit and at least one fastening member. The heat dissipation unit has a bottom face and a locating section. The locating section is formed with at least one channel in communication with the bottom face. The fastening member is assembled on the bottom face. The fastening member has at least one latch section correspondingly inserted in the locating section. The fastening member further has at least one locking section on one side of the fastening member, which side is distal from the bottom face.

The fastening member can be quickly assembled with the heat dissipation unit by means of manually inserting the latch section into the locating section of the heat dissipation unit. In addition, the fastening member is miniaturized and has a small volume so that the airflow can more easily flow to the surrounding of the electronic component to lower the temperature around the electronic component. Therefore, the heat dissipation efficiency is increased. Moreover, the heat dissipation device assembly structure is free from welding process so that the additional welding cost of the conventional heat dissipation unit and fastening means is saved.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
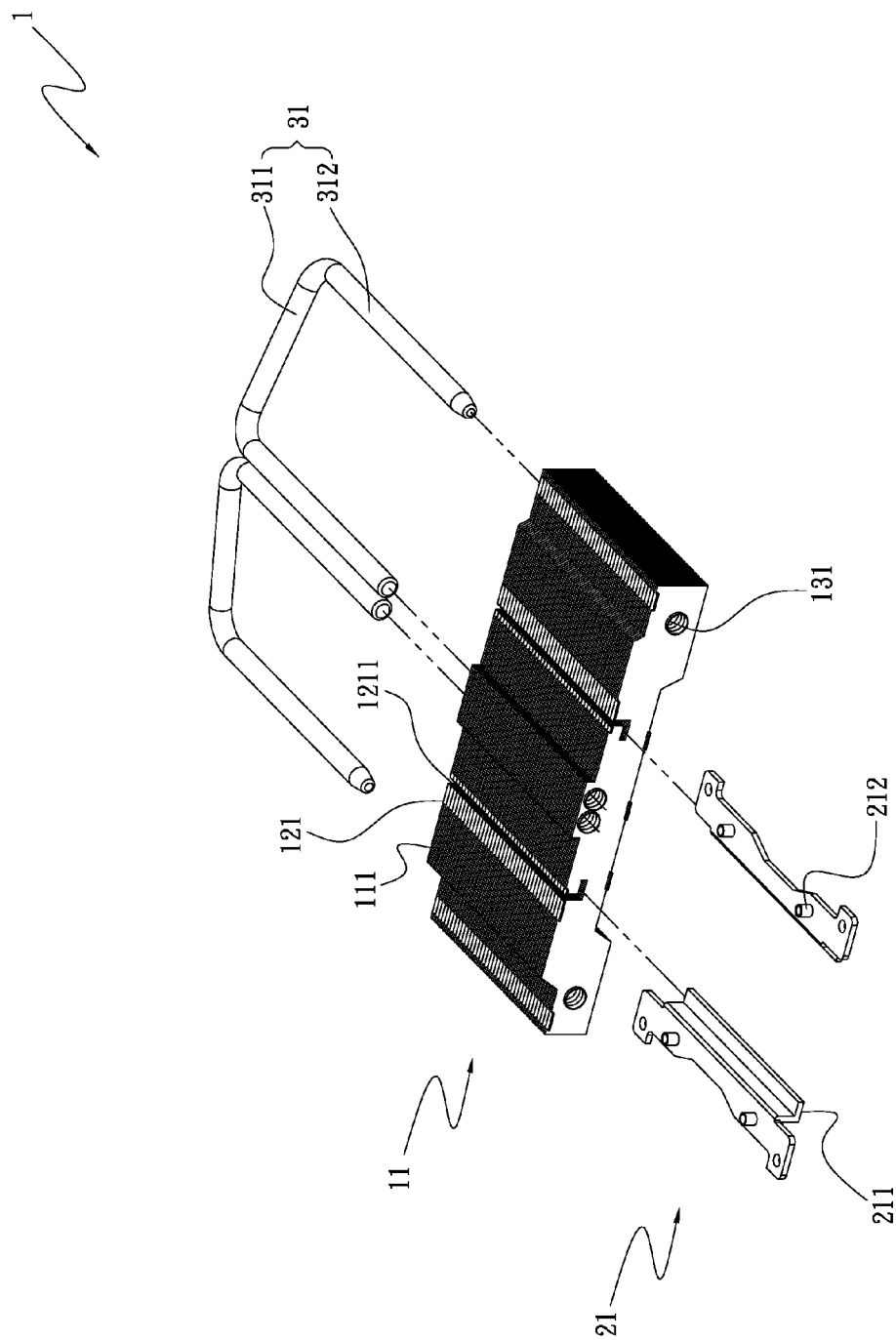
FIG. 1A is a perspective exploded view of a first embodiment of the heat dissipation device assembly structure of the present invention.
Figure 1B:
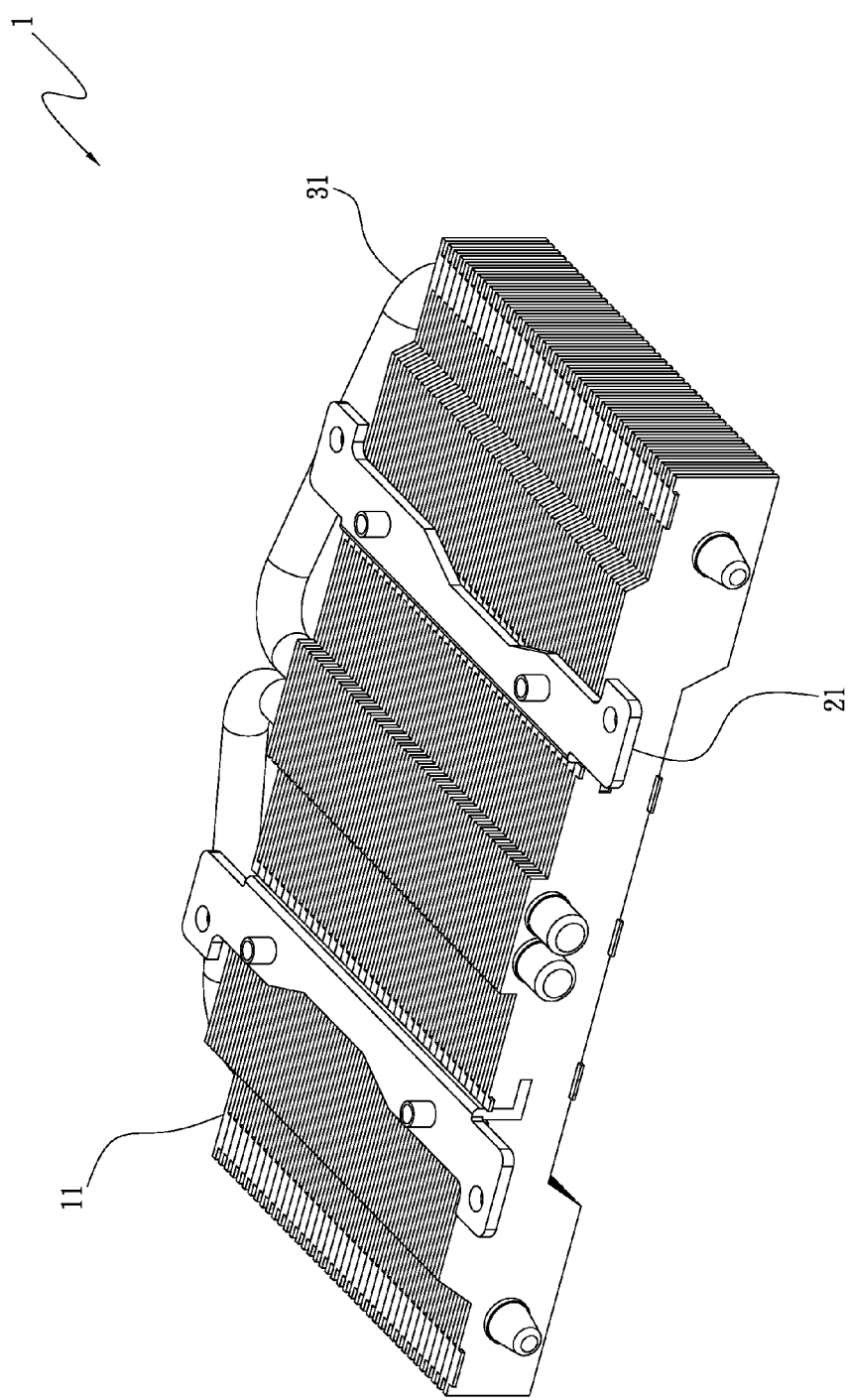
FIG. 1B is a perspective assembled view of the first embodiment of the heat dissipation device assembly structure of the present invention.

Please refer to FIGS. 1A and 1B. FIG. 1A is a perspective exploded view of a first embodiment of the heat dissipation device assembly structure of the present invention. FIG. 1B is a perspective assembled view of the first embodiment of the heat dissipation device assembly structure of the present invention. According to the first embodiment, the heat dissipation device assembly structure 1 of the present invention includes a heat dissipation unit 11 and at least one fastening member 21. The heat dissipation unit 11 has a bottom face 111 and a locating section 121. The locating section 121 is formed with at least one channel 1211 in communication with the bottom face 111. In this embodiment, the heat dissipation unit 11 is, but not limited to, a radiating fin assembly for illustration purposes only. Alternatively, the heat dissipation unit 11 can be a heat sink or any other component with heat dissipation function.

The fastening member 21 is assembled on the bottom face 111. The fastening member 21 has at least one latch section 211 correspondingly inserted in the locating section 121. The fastening member 21 further has at least one locking section 212 on one side of the fastening member 21, which side is distal from the bottom face 111.

The heat dissipation device assembly structure 1 of the present invention further includes a heat conduction unit 31 passing through the heat dissipation unit 11. The heat conduction unit 31 has a heat absorption section 311 and a heat conduction section 312. The heat conduction section 312 is connected with the heat absorption section 311 and inserted in the heat dissipation unit 11. The heat dissipation unit 11 is formed with multiple through holes 131 in which the heat conduction section 312 of the heat conduction unit 31 is fixedly inserted. In this embodiment, the heat conduction unit 31 is, but not limited to, a heat pipe for illustration purposes only. Alternatively, the heat conduction unit 31 can be any other component with heat conduction function.

Please further refer to FIGS. 1A and 1B. The fastening member 21 can be quickly assembled with the heat dissipation unit 11 only by means of inserting the latch section 211 of the fastening member 21 into the locating section 121 of the heat dissipation unit 11. In addition, the fastening member 21 is miniaturized and has a small volume so that the airflow will not be interrupted by the fastening member 21. In this case, the airflow can more easily flow to the surrounding of the electronic component to lower the temperature around the electronic component. Therefore, the heat dissipation efficiency is increased and thus the lifetime of the electronic component is prolonged. Moreover, thanks to the above structural design of the present invention, the additional welding cost of the conventional heat dissipation unit and fastening means is saved.

Figure 2:
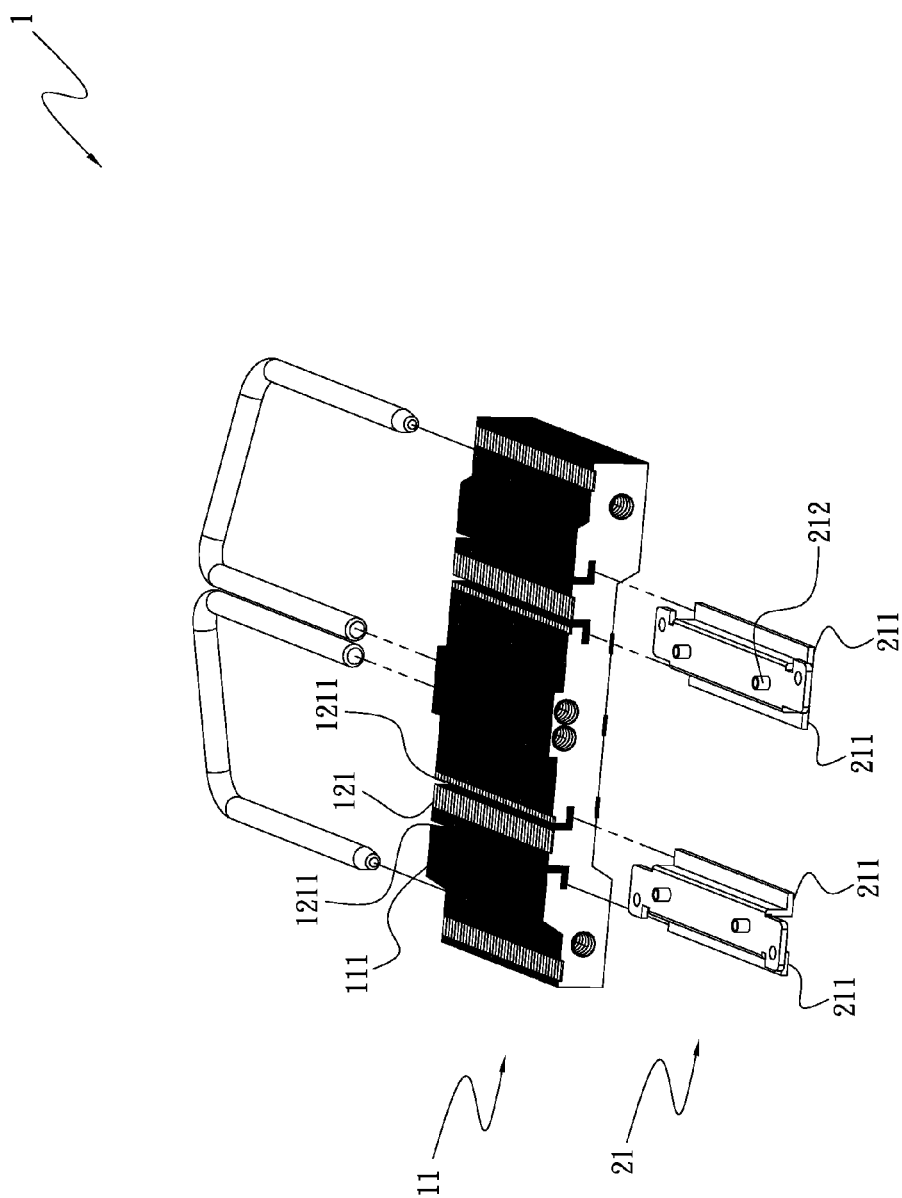
FIG. 2 is a perspective exploded view of a second embodiment of the heat dissipation device assembly structure of the present invention.

Please refer to FIG. 2, which is a perspective exploded view of a second embodiment of the heat dissipation device assembly structure of the present invention. The second embodiment is substantially identical to the first embodiment in component and the connection relationship between the components and thus will not be repeatedly described hereinafter. The second embodiment is mainly different from the first embodiment in that the locating section 121 is formed with two channels 1211 in communication with the bottom face 111. The fastening member 21 has two latch sections 211 correspondingly inserted in the channels 1211 of the locating section 121. The fastening member 21 can be quickly assembled with the heat dissipation unit 11 only by means of inserting the latch sections 211 of the fastening member 21 into the locating section 121 of the heat dissipation unit 11. In addition, the fastening member 21 of the heat dissipation device assembly structure 1 of the present invention is miniaturized so that the airflow will not be interrupted by the fastening member 21. Therefore, the airflow can more easily flow to the surrounding of the electronic component to lower the temperature around the electronic component. Accordingly, the heat dissipation efficiency is increased and thus the lifetime of the electronic component is prolonged. Moreover, the additional welding cost of the conventional heat dissipation unit and fastening means is saved.

Figure 3:
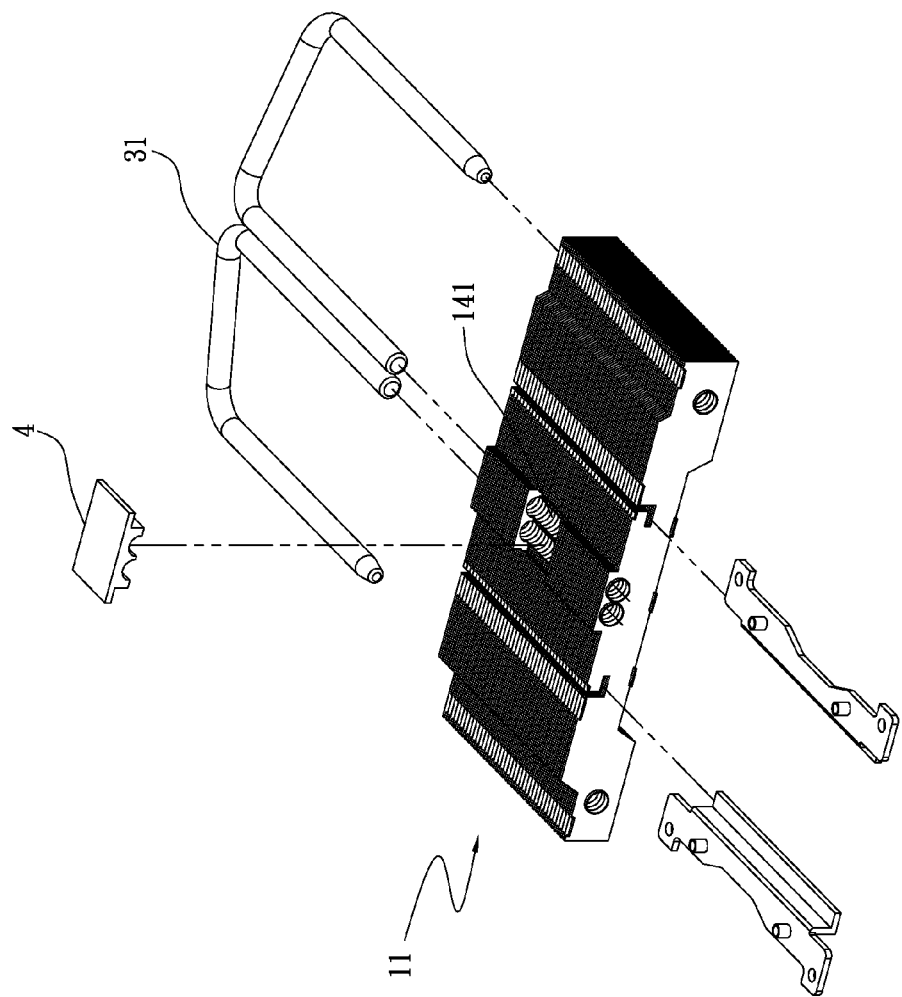
FIG. 3 is a perspective exploded view of a third embodiment of the heat dissipation device assembly structure of the present invention.

Please refer to FIG. 3, which is a perspective exploded view of a third embodiment of the heat dissipation device assembly structure of the present invention. The third embodiment is substantially identical to the first embodiment in component and the connection relationship between the components and thus will not be repeatedly described hereinafter. The third embodiment is mainly different from the first embodiment in that the heat dissipation unit 11 further has a receiving section 141. A base seat 4 is attached to the receiving section 141 and directly assembled with the heat conduction unit 31 by press fit. The base seat 4 is directly affixed and attached to the receiving section 141 of the heat dissipation unit 11 by press fit without welding. Therefore, the additional welding cost of the conventional heat dissipation unit and base seat is saved.

In conclusion, in comparison with the conventional technique, the present invention has the following advantages:
1. The heat dissipation efficiency is increased.
2. The cost is lowered.
3. The lifetime of the electronic component is prolonged.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation device assembly structure comprising:
   a heat dissipation unit consisting of a plurality of fins and having a bottom face, a locating section and multiple through holes, the locating section being formed with at least one L-shaped channel in communication with the bottom face;
   a fastening member assembled on the bottom face, the fastening member having at least one latch section correspondingly inserted in the locating section, the fastening member further having at least one convex cylindrical-shaped locking section on one side of the fastening member, which side is distal from the bottom face; and
   a heat conduction unit passing through the heat dissipation unit, the heat conduction unit having a heat absorption section and a heat conduction section, the heat conduction section being connected with the heat absorption section and inserted in the through holes of the heat dissipation unit.

2. The heat dissipation device assembly structure as claimed in claim 1, wherein the heat conduction unit is a heat pipe or any other component with heat conduction function.

3. The heat dissipation device assembly structure as claimed in claim 1, wherein the heat dissipation unit further has a receiving section, a base seat being attached to the receiving section and directly assembled with the heat conduction unit by press fit.

* * * * *